United States Patent [19]

Nishihara et al.

[11] Patent Number: 5,109,430
[45] Date of Patent: Apr. 28, 1992

[54] MASK ALIGNMENT AND MEASUREMENT OF CRITICAL DIMENSIONS IN INTEGRATED CIRCUITS

[75] Inventors: H. Keith Nishihara, Los Altos; P. A. Crossley, Palo Alto, both of Calif.

[73] Assignee: Schlumberger Technologies, Inc., San Jose, Calif.

[21] Appl. No.: 604,390

[22] Filed: Oct. 24, 1990

Related U.S. Application Data

[63] Continuation of Ser. No. 314,253, Feb. 21, 1959, abandoned, which is a continuation of Ser. No. 889,055, Jul. 22, 1986, abandoned.

[51] Int. Cl.$^5$ ............................................. G06K 9/00
[52] U.S. Cl. ........................................ 382/8; 356/394; 358/107; 382/31; 382/45
[58] Field of Search ..................... 382/8, 42, 48, 54, 45, 382/31; 356/394, 401; 358/101, 107; 350/162.12, 162.13

[56] References Cited

U.S. PATENT DOCUMENTS

| | | | |
|---|---|---|---|
| 3,617,625 | 11/1971 | Redpath | 382/42 |
| 4,386,411 | 5/1983 | Risk | 358/101 |
| 4,394,683 | 7/1983 | Wagner | 358/107 |
| 4,399,205 | 8/1983 | Bergendahl | 430/30 |
| 4,403,859 | 9/1983 | Ernst | 250/237 G |
| 4,441,207 | 4/1984 | Lougheed | 382/8 |
| 4,442,188 | 4/1984 | Chiang | 356/401 |
| 4,531,060 | 7/1985 | Suwa | 250/557 |
| 4,549,084 | 10/1985 | Markle | 250/548 |
| 4,568,189 | 2/1986 | Bass | 356/401 |
| 4,579,455 | 4/1986 | Levy et al. | 356/394 |
| 4,626,907 | 12/1986 | Schedewie | 356/401 |
| 4,633,504 | 12/1986 | Wihl | 382/54 |
| 4,636,626 | 1/1987 | Hazama | 250/557 |
| 4,648,120 | 3/1987 | Chittineni | 382/54 |
| 4,652,134 | 3/1987 | Pasch | 356/401 |

FOREIGN PATENT DOCUMENTS 2067744 7/1981 United Kingdom .
2151104 7/1985 United Kingdom .

OTHER PUBLICATIONS

H. K. Nishihara, "Practical Real–Time Imaging Stereo Matcher," *Optical Engineering* (1984) 23(5):536–545.
H. K. Nishihara et al., "Towards a Real Time Implementation of the Marr and Poggio Stereo Matcher," *Image Understanding* (1981), Proceedings of Workshop Sponsored by the Defense Advanced Research Projects Agency, Report No. SAI-82-391-WA, pp. 114–120.
H. K. Nishihara, "Intensity, Visible–Surface, and Volumeric Representations," i *Artificial Intelligence* (1981) 17:265–284.

*Primary Examiner*—Leo H. Boudreau
*Attorney, Agent, or Firm*—Townsend and Townsend

[57] ABSTRACT

A method for determining alignment and critical dimensions of regions formed on a semiconductor structure during one or more process steps includes the steps of defining a pattern A at a first location on the semiconductor device during a process step, defining a second independent pattern B at the first location on the semiconductor structure during another process step, acquiring an image of the combination A and B of both the first and second patterns, filtering that image to attenuate higher spatial frequencies while preserving lower spatial frequencies, and comparing the sign result of the filtered image with the sign result of a stored image of the individual patterns to determine alignment errors. In the preferred embodiment the step of filtering includes taking the Laplacian of Gaussian convolution of the image and saving the sign of the result. The comparison between the filtered image and the stored image uses the correlation function for the filtered images. Special circuitry is disclosed for performing the method rapidly enough to enable commercial applications.

33 Claims, 9 Drawing Sheets

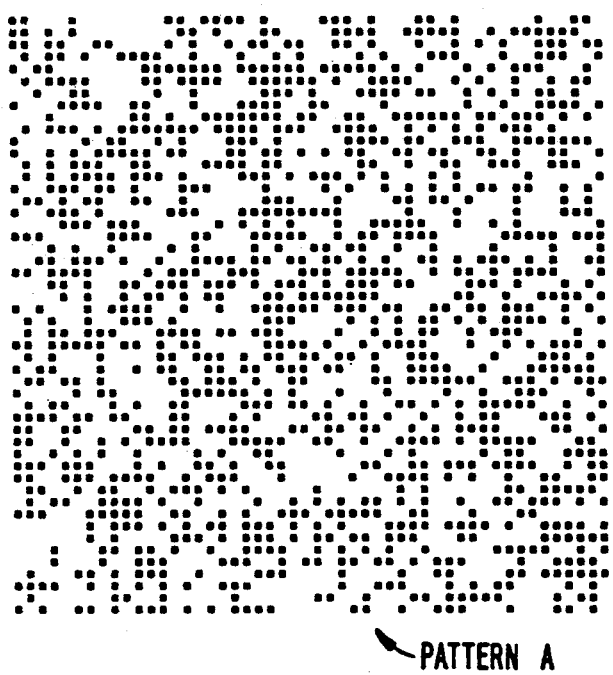
FIG._1. PATTERN A
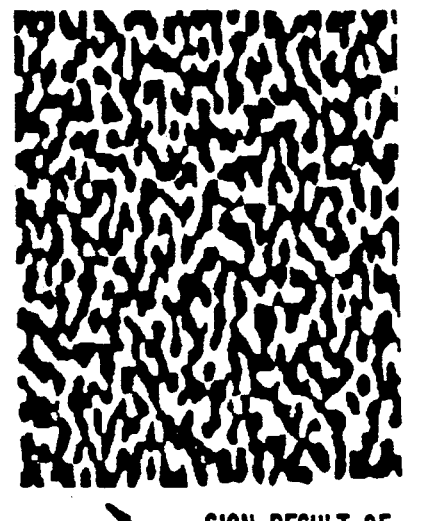
SIGN RESULT OF FILTERED PATTERN A
FIG._3.
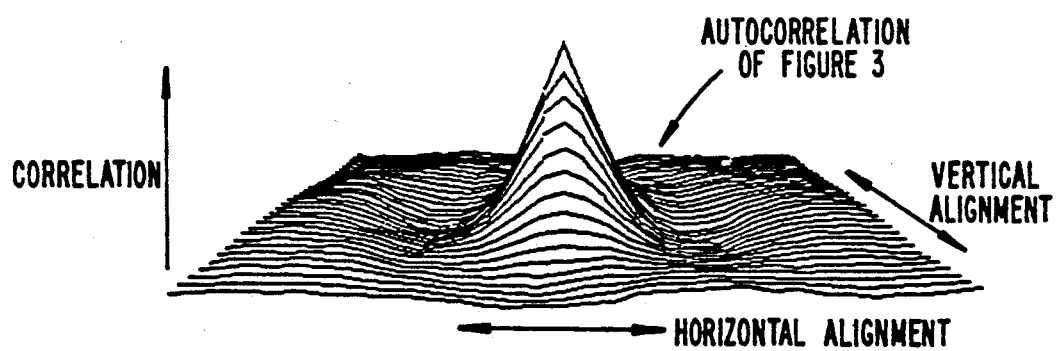
AUTOCORRELATION OF FIGURE 3
CORRELATION
VERTICAL ALIGNMENT
HORIZONTAL ALIGNMENT
FIG._4.

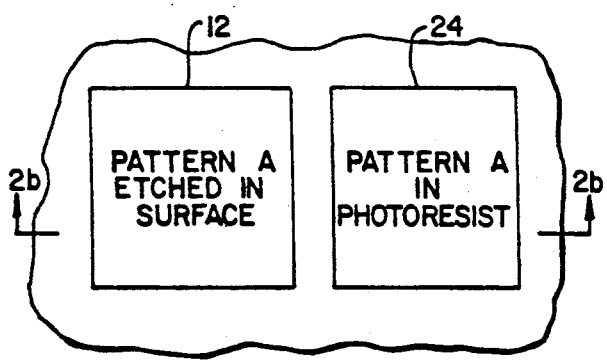
FIG._2a.
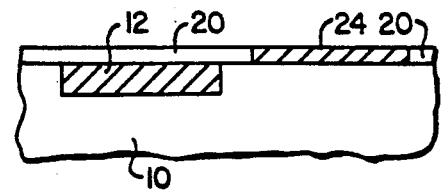
FIG._2b.
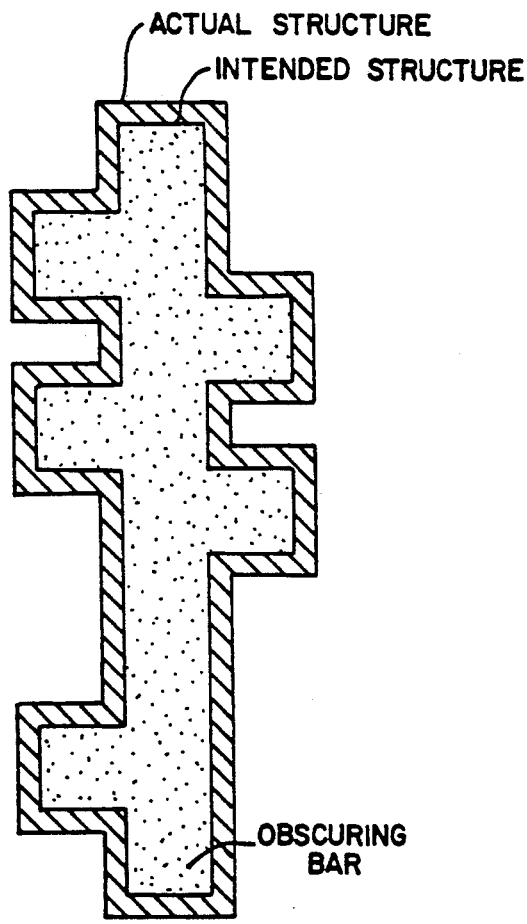
FIG._11a.
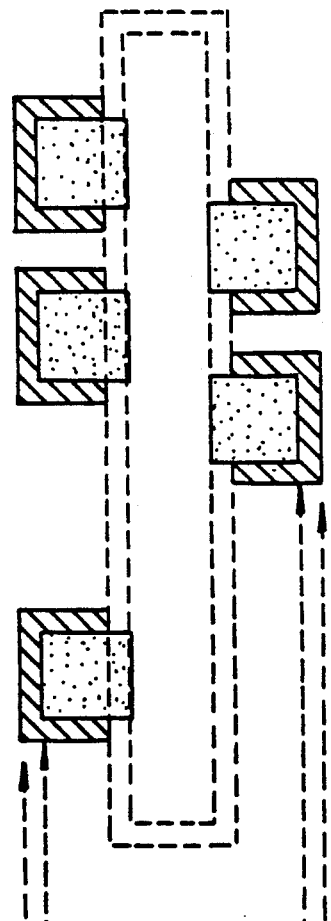
FIG._11b.

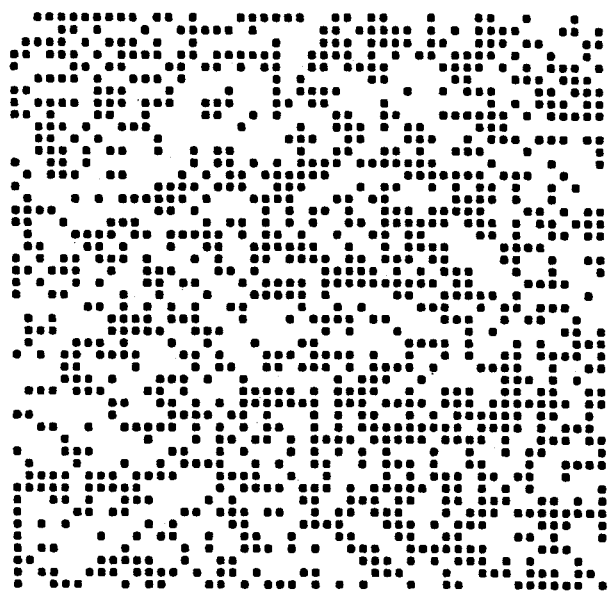
PATTERN B
FIG._5.
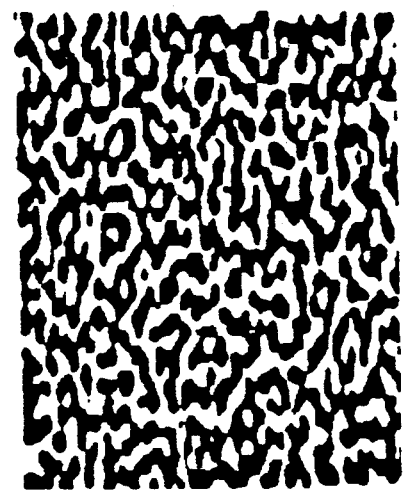
SIGN RESULT OF FILTERED PATTERN B
FIG._7.
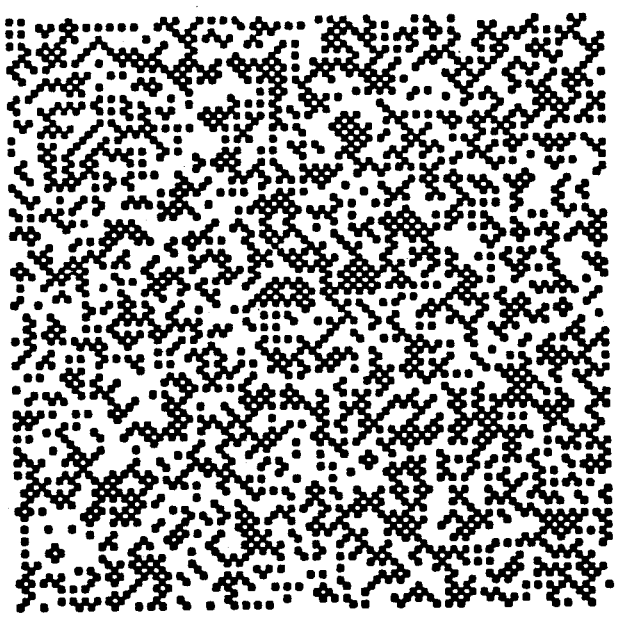
PATTERNS A+B
FIG._6.
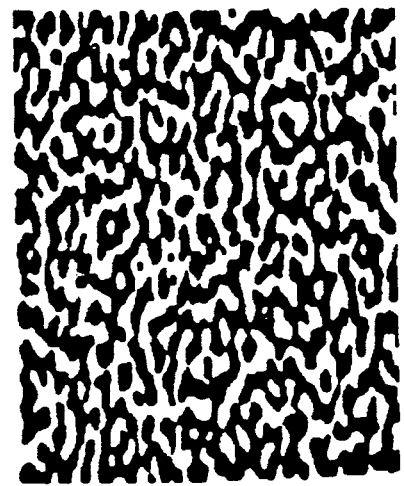
SIGN RESULT OF FILTERED PATTERN A+B
FIG._8.

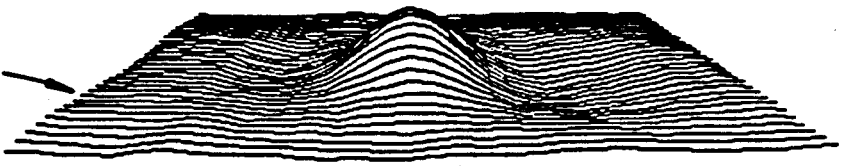
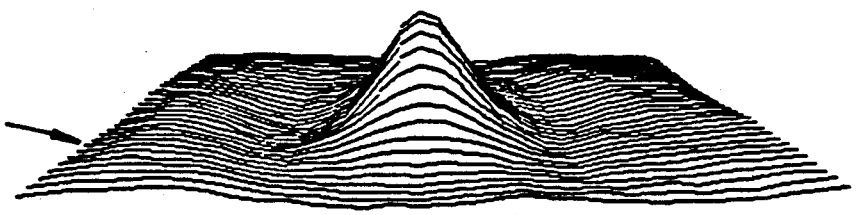
FIG._9.
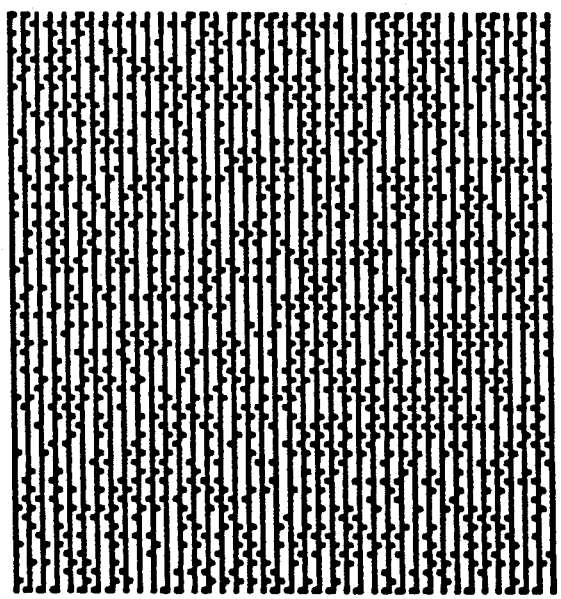
FIG._10.

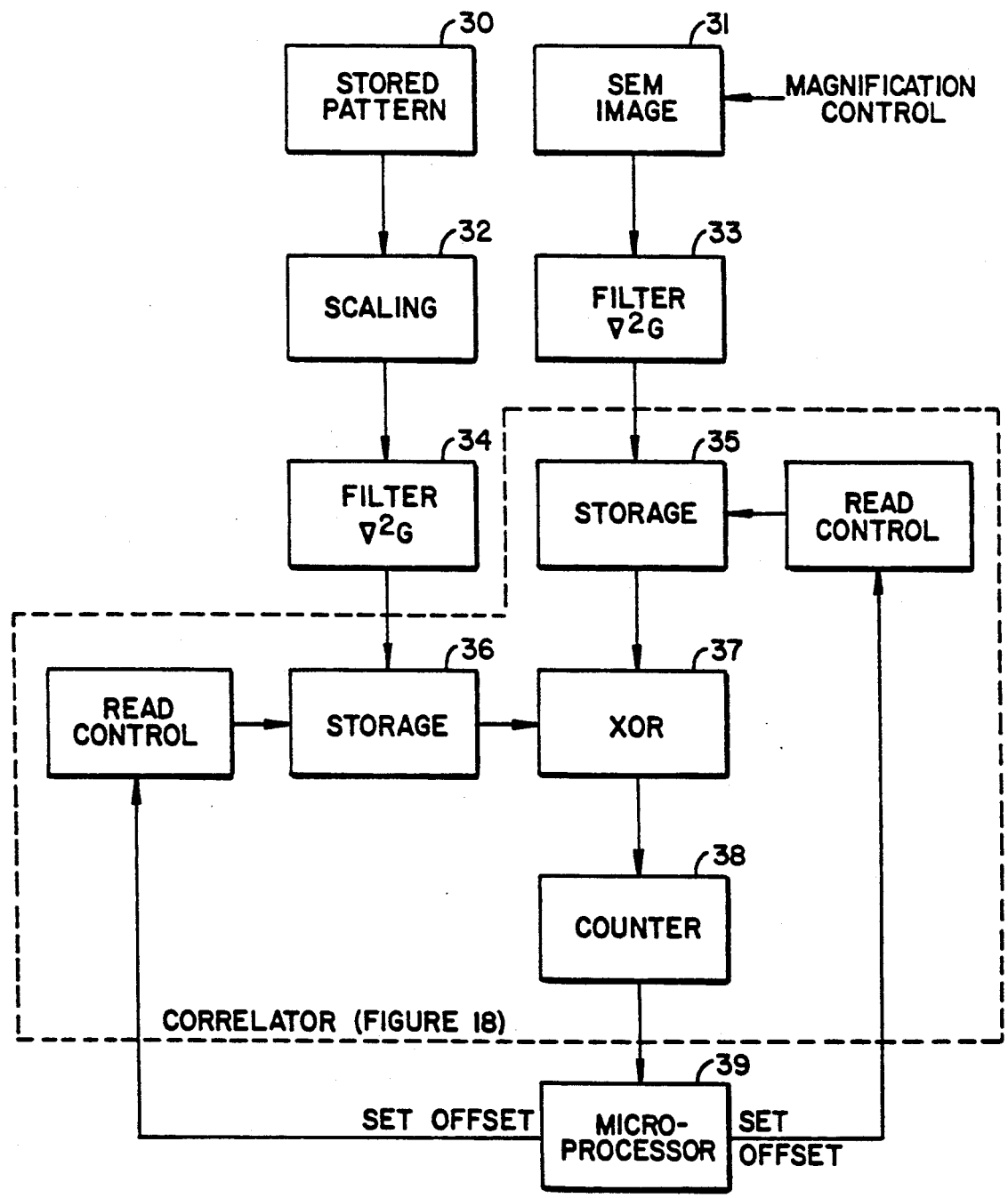
FIG._12.

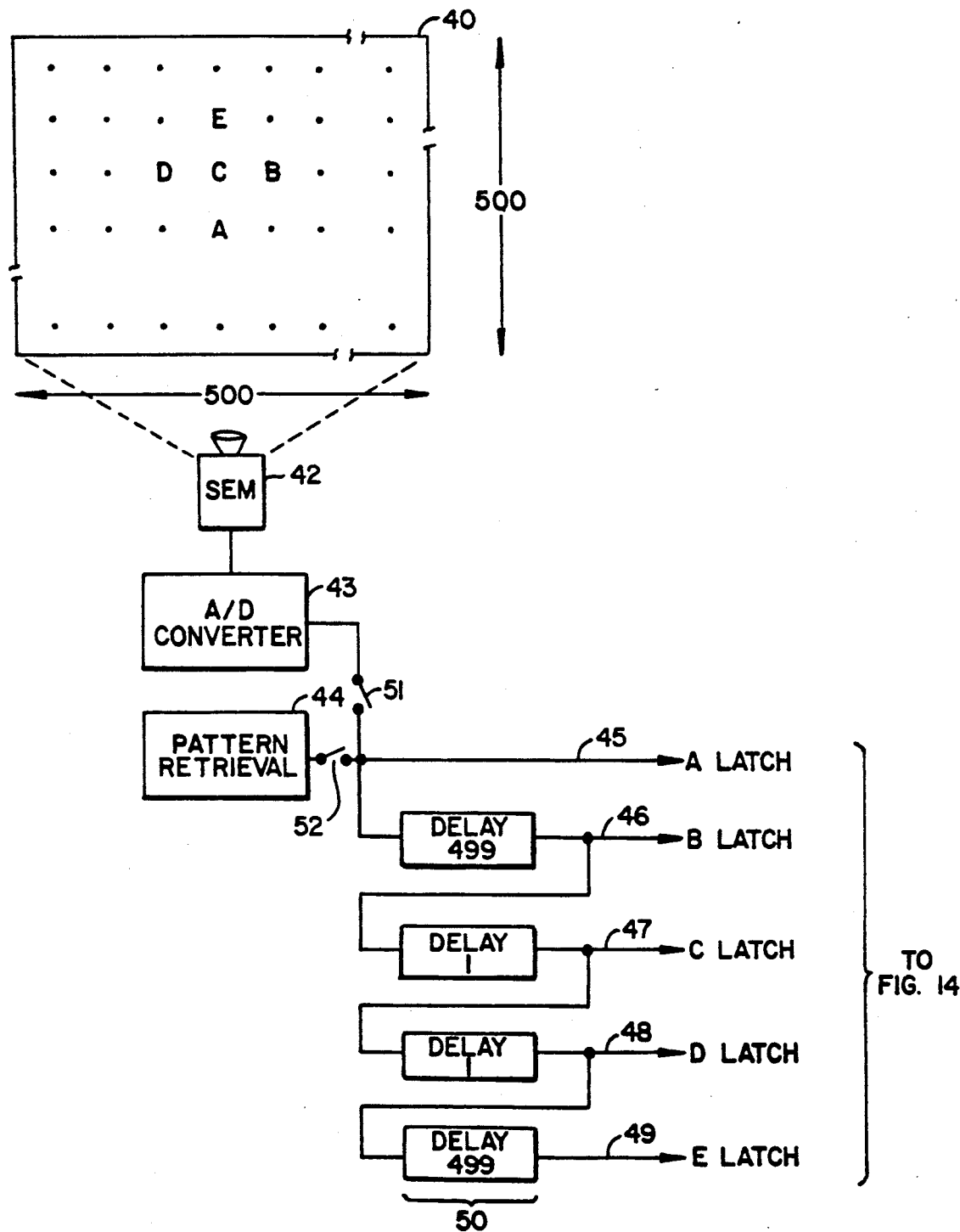
FIG._13.

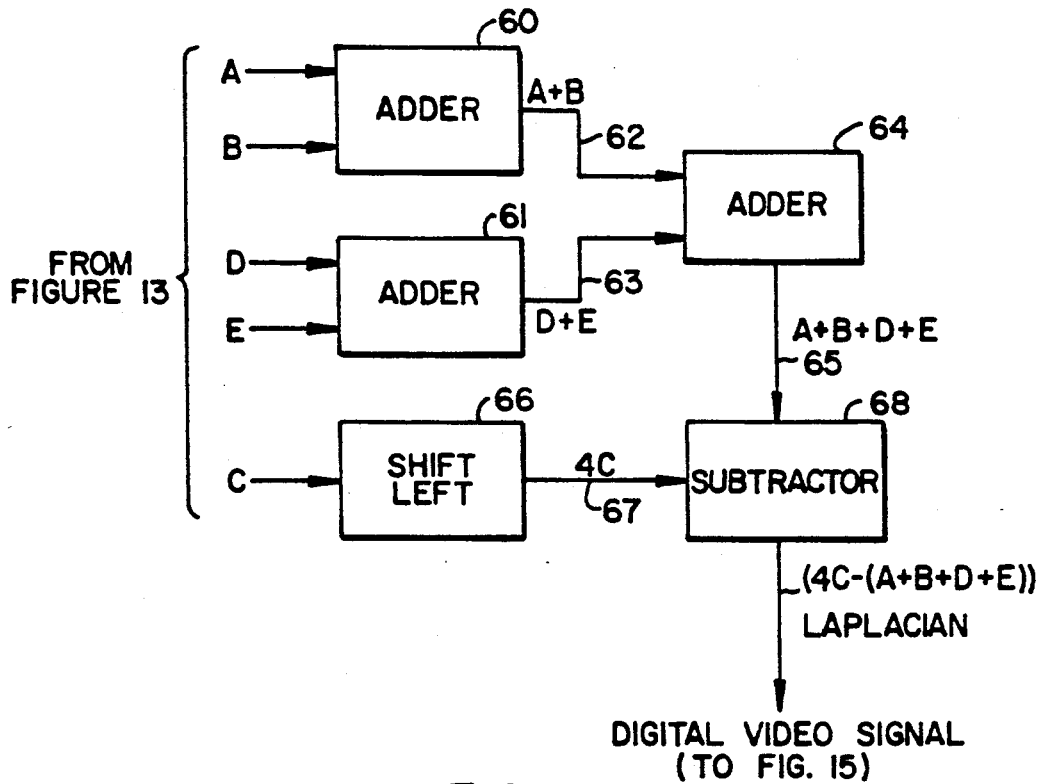
FIG._14.
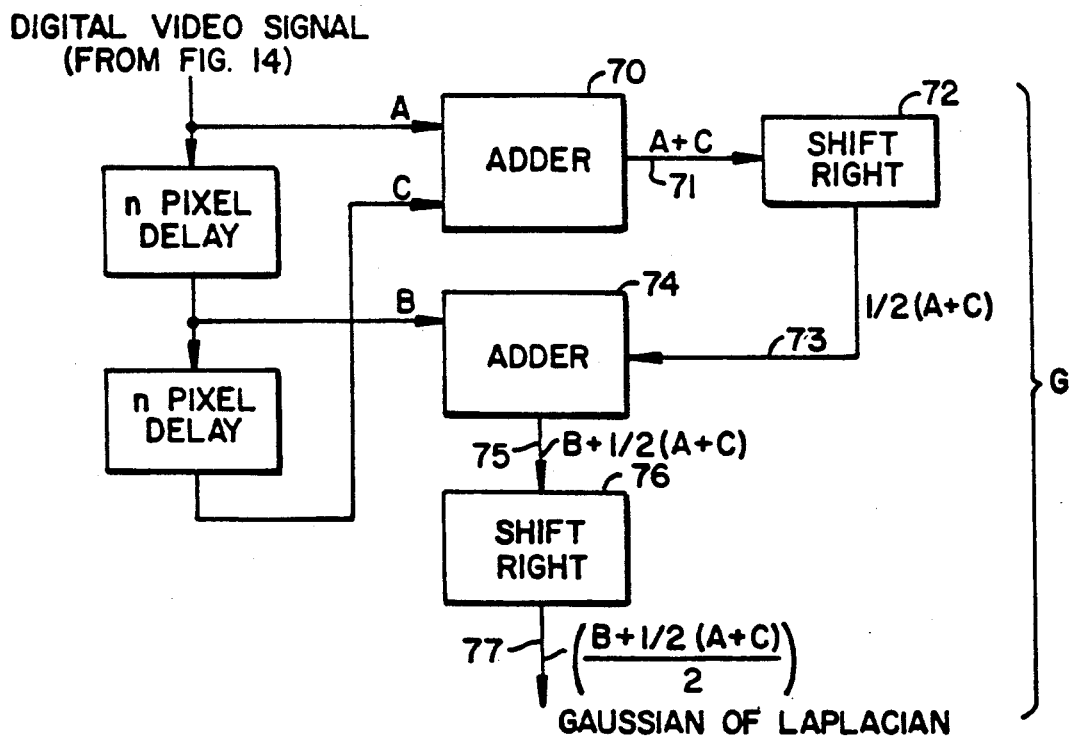
FIG._15.

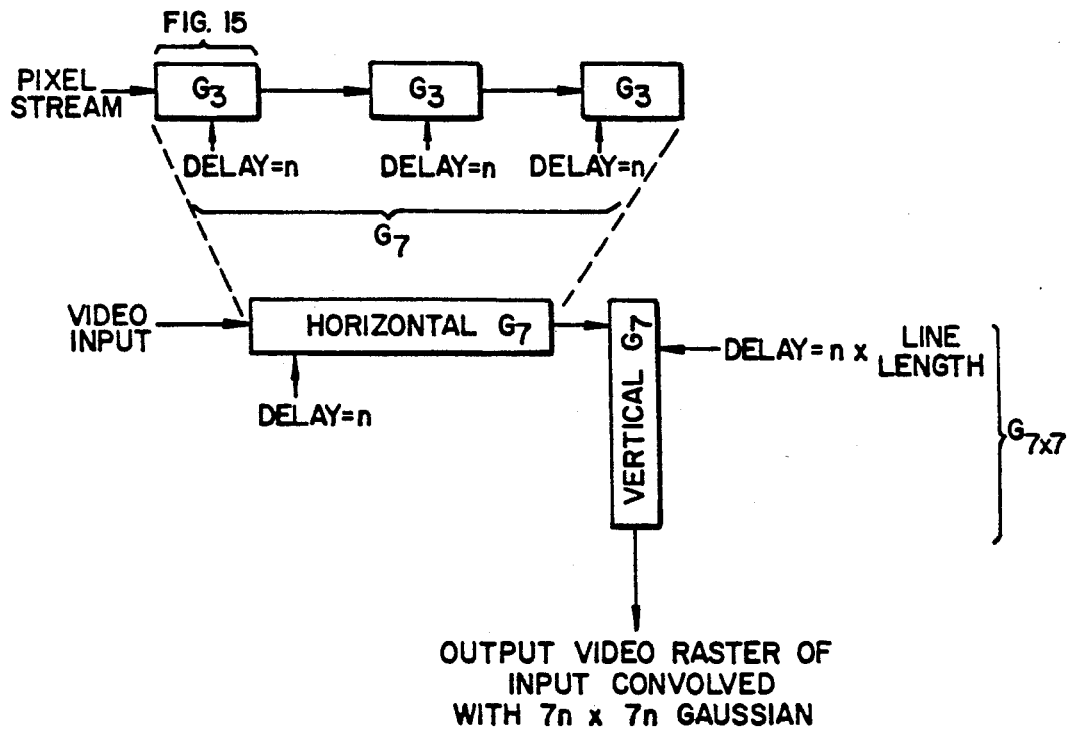
FIG._16.
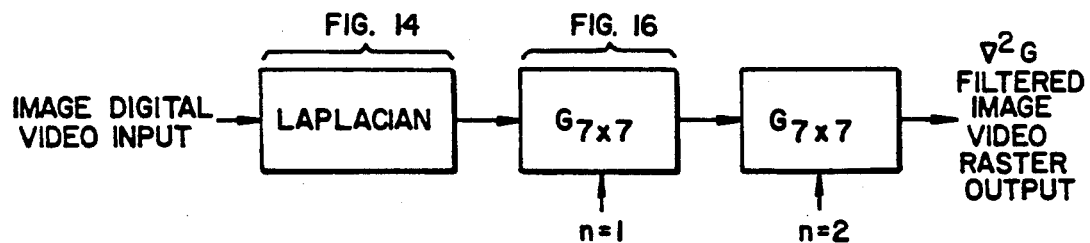
FIG._17.

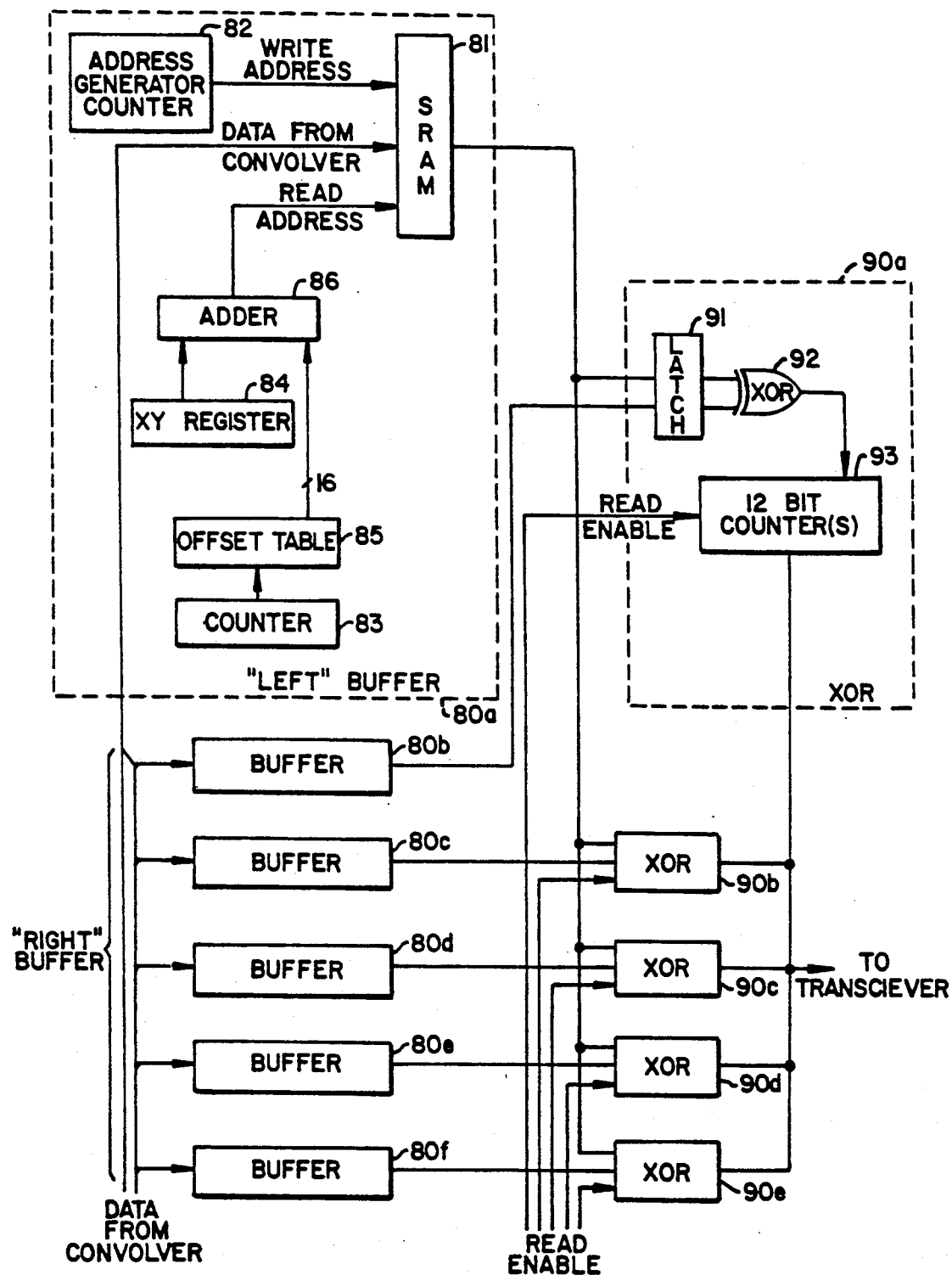
FIG._18.

MASK ALIGNMENT AND MEASUREMENT OF CRITICAL DIMENSIONS IN INTEGRATED CIRCUITS

This is a continuation of application Ser. No. 07/314,253, filed Feb. 21, 1989, now, which is a continuation of Ser. No. 06/889,055, filed Jul. 22, 1986, now abandoned.

BACKGROUND OF THE INVENTION

1. Field of the Invention

This invention relates to the manufacture of integrated circuits, and specifically to a system for measuring and controlling the alignment of various layers in such circuits, as well as to a system for measuring critical dimensions of integrated circuits. The system permits alignment of masks and measurement of critical dimensions with accuracy greater than the resolution of the optical system employed in performing the alignment and measurements.

2. Description of the Prior Art

In the manufacture of integrated circuits, a semiconductor wafer, typically silicon, is subjected to a complex series of process operations to define active and passive components by doping regions within the wafer with impurities. During and after these operations, layers of electrically conductive and insulating material are deposited and defined on the wafer to interconnect the active and passive components into a desired integrated circuit. The processing of the wafer usually employs techniques in which masking layers of various materials, such as photoresist, are deposited across the upper surface of the wafer. Using photolithographic or other techniques, openings are defined in the photoresist or masking layers to allow selective introduction of P- and N-conductivity type dopants, such as boron, phosphorus, arsenic and antimony, through the surface of the silicon wafer. These doped regions provide components, such as transistor emitters, resistors, etc., of the integrated circuit. In state-of-the-art integrated circuit fabrication technology, many separate masks are employed to define the ultimate integrated circuit. For example, some bipolar circuit fabrication processes employ 13 different masks to selectively expose photoresist layers during different processes.

The economic revolution in electronics continues to be the result of the integrated circuit manufacturer's ability to place more and more components in a smaller and smaller area of the wafer. Because the cost of processing a single wafer is fixed, and substantially independent of the number of devices formed therein, decreasing the size of individual devices, increases the number of devices formed in a wafer, and results in lower cost per device.

As the individual components on an integrated circuit become progressively smaller, however, the importance of aligning each mask with the underlying wafer becomes greater. For example, if the minimum spacing between two electrically conductive lines on an integrated circuit is 5 microns, a 1-micron mask misalignment will not electrically short the lines to each other. On the other hand, a 1-micron misalignment on an integrated circuit having a minimum feature size of 1 micron will destroy the functionality of the circuit. Conductive lines will be shorted to each other, while transistor components will be so misplaced as to render the devices nonfunctional. Thus, as the integrated circuit industry's capability to place more components on a given size chip increases, the importance of properly aligning each overlying layer with the underlying wafer becomes greater.

One traditional approach to aligning or checking alignment of a layer with respect to the underlying structure, for example, a photoresist pattern deposited on the wafer, employs comb-shaped alignment patterns. A first comb-shaped pattern, for example, with teeth pointed north, is fabricated on the wafer in an early process operation. A complementary comb-shaped pattern with teeth facing south and with a slightly different spacing between the teeth is formed later, for example, in a photoresist pattern applied to the wafer. The second pattern is offset from the first pattern so that the tips of the teeth of the two patterns mesh. The slightly different spacings of the teeth allow only one pair of opposing teeth to be aligned with each other at a time. The position of the aligned pair in the comb pattern provides a sensitive measure of the alignment error between the two layers.

This vernier alignment pattern has proven satisfactory for many applications; however, distortion due to interference fringes in the optical images of the patterns make the line position difficult to determine. Furthermore, the area of comparison in the comb structure is a very small region where the teeth approach each other. Thus, the pattern may be employed effectively by automatic alignment measurement systems only if the imaging device by which the pattern is viewed has resolution as fine as the desired alignment measurement and has very low noise levels as well. Additionally, the inherent accuracy limit is determined by the digitizing grid used by the main circuit layout. It is desirable to overcome this limitation.

A further deficiency of present alignment patterns is that automatic measurement with the patterns requires complex software for identifying the patterns, recognizing the teeth, etc. Thus, automating the alignment of such patterns is difficult. Of course, aligning such patterns manually is undesirably labor intensive, and subject to operator interpretation. Such measurements are tedious and subjective, and the operator must key the results into a terminal to control a computer integrated manufacturing system.

Critical dimensions on a layer of an integrated circuit, as opposed to alignment of different layers, usually are measured by human operators. A test pattern fabricated on the circuit usually has a series of parallel bars, each having a width equal to the critical dimension, and each spaced apart from adjacent bars by the critical dimension. Overexposure, assuming positive photoresist, results in the bars being narrower than desired, consequently increasing the width of the spaces between them. Underexposure had the opposite effect, widening the bars and narrowing the spaces. Using a microscope, the human operator measures the critical dimension by comparing the bar/space ratio to assure that it is within tolerances. Of course, this approach requires operator intervention, and is susceptible to the same difficulties in interpretation as described above, that is, distortion due to interference fringes, distortion of the optical system used to examine the test pattern, and extreme difficulty in automating the measurement procedure.

In another approach, an automated system is employed whereby the bars and spaces are viewed with a microscope and television monitor. Using a gating network, one or more raster scans are selected for display on an oscilloscope to allow determination of bar/space dimensions. Unfortunately this approach suffers from the same disadvantages described above. Furthermore, it is difficult to determine precisely which part of the waveform corresponds to the edge of the bar or space.

SUMMARY OF THE INVENTION

An improved technique is desired for aligning overlying layers on integrated circuits, checking their alignment, and measuring critical dimensions on such circuits. We have developed a system which overcomes the deficiencies of prior art alignment and measurement techniques for integrated circuits, and which allows alignment and measurement of critical dimensions to be made automatically, with minimal or no operator assistance. Our method employs alignment targets comprised of isolated fine scale marks fabricated at the feature size limit of the process employed for the integrated circuit. The marks are arranged in an irregular, typically random, pattern over a two-dimensional area of the circuit. The patterns are built with small sparse elements in a nonrepeating or irregular fashion, and are designed to have a large amount of low-spatial frequency energy. In our preferred embodiment, the patterns are constructed using a random number generator to determine the locations on a two-dimensional lattice having a dot. FIG. 1 is an example of one such pattern.

Once an image of the pattern is acquired, for example, using conventional optical or SEM techniques, the image is digitized and filtered to enhance the low frequency information in the pattern while attenuating the high frequency information. Destruction of detailed fine information in this manner makes our invention less sensitive to noise and the optical vagaries of the measurement apparatus. Correlation techniques may then be employed to determine alignment and/or critical dimensions of the integrated circuit.

The system we have developed is insensitive to many process and sensor-related distortions which appear in images of small features. The technique also permits superimposition of two different patterns while enabling measurement of the position of each of them. Thus, if one pattern is defined on the wafer, and the second is placed in photoresist on top of the first, the relative alignment of the two patterns may be automatically determined.

In one embodiment of our system, a method of determining the alignment of regions formed on a semiconductor structure during separate process steps includes the steps of defining a first irregular pattern of elements at a first location on the semiconductor structure during a first process step, defining a second irregular pattern of elements also at the first location on the semiconductor structure during the second process step, acquiring an image of both the first and second patterns at the first location to provide an image thereof, filtering the image to attenuate at least some higher spatial frequencies while preserving at least some lower spatial frequencies to thereby provide a filtered image, and comparing the filtered image with the stored image of at least one of the first or the second pattern to thereby determine the alignment of regions on the semiconductor structure.

In an alternate embodiment the first and second patterns are spaced apart from each other to enable alignment by measurement of the distance between the two patterns. In a further embodiment obscuring bars are extended through parts of the pattern to hide edges of the individual elements, and enable determination of critical dimensions on the semiconductor structure.

BRIEF DESCRIPTION OF THE DRAWINGS

FIG. 1 is an irregular alignment pattern of the type employed in the preferred embodiment of the invention;

FIGS. 2a and 2b illustrate schematically two such alignment patterns in adjacent locations on a wafer, FIG. 2a being a top view and FIG. 2b a cross-sectional view;

FIG. 3 is a filtered image of FIG. 1 showing the sign result after application of a Laplacian of Gaussian convolution operator;

FIG. 4 is the correlation function of the sign array of FIG. 3;

FIG. 5 is a second irregular alignment pattern of the type employed with the pattern of FIG. 1;

FIG. 6 is a combination of the patterns of FIGS. 1 and 5;

FIG. 7 is the filtered image of FIG. 5;

FIG. 8 is the filtered image of FIG. 6;

FIG. 9 illustrates the correlation function of FIGS. 7 and 8, and of FIGS. 3 and 8, illustrating alignment of the peaks of the correlation functions;

FIG. 10 is a pattern used to measure critical dimensions on an integrated circuit;

FIGS. 11a and 11b illustrate the manner by which the pattern of FIG. 10 is employed in measuring critical dimensions;

FIG. 12 is a block diagram illustrating one system for correlating two filtered images;

FIG. 13 is a block diagram illustrating one technique for collecting pixel values for computing the Laplacian at video rates;

FIG. 14 is a block diagram illustrating one technique for obtaining the Laplacian of the pixel values collected in FIG. 13;

FIG. 15 is a block diagram of the basic computing element of one technique for obtaining a Gaussian convolution at video rates;

FIG. 16 illustrates the repeated application of the technique of FIG. 15 to compute a seven by seven two-dimensional Gaussian convolution of the Laplacian filtered signal from FIGS. 14 and 16;

FIG. 17 is a block diagram illustrating the combining of the Laplacian with two seven by seven Gaussian elements to efficiently produce a 21 by 21 Gaussian of Laplacian convolution; and FIG. 18 is a block diagram of the correlator used to compare filtered images.

DETAILED DESCRIPTION OF THE PREFERRED EMBODIMENTS

Our invention includes a method for measuring alignment and measuring critical dimensions on an integrated circuit structure as well as apparatus for carrying out that method. The method is described below, followed by a description of the apparatus.

Method of Operation

We have developed a method for measuring alignment accuracy of overlying layers on integrated circuit structures. Our method employs alignment targets which are built up from isolated fine scale marks, typically marks fabricated at the feature size limit of the process employed to manufacture the integrated circuit. In a preferred embodiment, these fine marks are spread out in a pattern in a two-dimensional array to form a target. Typically, the target will occupy a region of the integrated circuit where circuitry is not to be formed, for example, between bonding pads or in a region interior to the bonding pads.

In the preferred embodiment, our fine scale features consist of small square "dots" distributed in an array. In the example the array consists of a matrix of 50 by 50 *potential* dot locations, with each potential dot being separated from its neighbors by the minimum dimension, i.e., one dot width. FIG. 1 is an example of such a matrix. The *actual* locations for dots in the array of 50 by 50 potential dots are randomly selected. For the example shown in FIG. 1, the determination of whether to place a dot in a given location is made employing a random number generator with a 50% probability at each location. The pattern ("A") shown in FIG. 1 is not repeating and has a large low frequency content of spatial information, that is, the dots and spaces tend to organize themselves into clusters. With respect to an integrated circuit, the pattern depicted might be fabricated by etching, oxidizing, diffusion, ion implantation, or any other well known process by which a detectable pattern may be formed in an integrated circuit structure.

The particular pattern employed is not critical to our invention. Almost any pattern with sufficient low frequency structure may be used, including regular patterns. If regular patterns are chosen, then alignment can be made to a single instance of the pattern, but which instance must be otherwise specified. It is desirable for the pattern to contain low frequency information on two independent axes if alignment in two dimensions is sought. To provide relative insensitivity to optical distortion, high frequency noise and aliasing, the two-dimensional power spectrum of the pattern, should have significant energy distributed over at least an annulus centered on the origin of the power spectrum.

In accordance with one embodiment of our method, a second pattern having small sparse elements will be formed in the next layer of the integrated circuit in proximity, but not overlying, the pattern shown in FIG. 1. For example, as shown in FIG. 2a, if the pattern shown in FIG. 1 is formed in the semiconductor wafer 10 itself, then another pattern 24 may be formed in photoresist layer 20 spaced apart from the pattern in wafer 10. In this embodiment pattern 24 usually will be identical to pattern 12, although this is not necessary. In a manner explained below, alignment of pattern 24 in the photoresist with the pattern 12 in the wafer 10 may be verified using the method of our invention. Of course, because formation of the pattern is accomplished by the same process and at the same time as formation of the surrounding components of the integrated circuit, the proper alignment of the two patterns verifies the proper alignment of the two layers and all of the components fabricated therein or thereby.

Of substantial significance to the invention, the alignment of the components to be formed using the photoresist 20 with the underlying wafer 10 may be verified *before* the components are formed in the integrated circuit, that is, before the diffusion etching or other step is carried out. In this manner, if pattern B in the photoresist 20 has been incorrectly positioned, the layer of photoresist may be stripped from the wafer (using well known techniques), a new layer of photoresist applied, and a new pattern defined therein. Fabricating the circuit in this manner assures that all of the regions formed in the wafer are properly aligned with respect to each other—eliminating mask misalignment as a source of reduced yield.

Once the two patterns are fabricated adjacent to each other in the manner depicted in FIGS. 2a and 2b, direct measurements could be made between the two patterns to determine their relative alignment. It is difficult to perform such measurements with the necessary accuracy, however, as it is desired to align the two patterns to within substantially less than one dot diameter. We have discovered that by discarding some of the high frequency (detailed) information, while retaining some of the low frequency (clustering) information of FIG. 1, alignment of the two regions may be achieved with greater accuracy than in the prior art, and relatively independent of the quality of the optical system employed.

In the preferred embodiment, images of the two targets 12 and 24 are acquired using conventional optical or scanning electron microscope technology. Once the image is acquired, it is digitized and a filtering operation is performed to enhance the low frequency structure in the pattern while attenuating the high frequency information. The result is a filtered image such as depicted in FIG. 3.

Although many different types of filters may be employed to enhance the low frequency structure, in the preferred embodiment a Laplacian of Gaussian ($\nabla^2 G$) convolution operator is used. The Gaussian is a two-dimensional Gaussian which functions to low pass filter the image in a way that attenuates high spatial frequencies while preserving the geometric structure at lower spatial frequencies. The size of the Gaussian controls the scale at which structure remains in the filtered image. The Laplacian term detects locations in the low pass filtered image where local maxima in the rate of brightness change occur. These locations coincide closely with the locations where the Laplacian has zero value. It is known that:

$$(\nabla^2 G) * I = \nabla^2(G*I) = G * (\nabla^2 * I) \qquad (1)$$

where $\nabla^2$ is the Laplacian, G is the Gaussian and I represents the image. Hence, the order in which the operators are applied will not effect the result.

Application of the Laplacian of Gaussian convolution operator and taking the sign of the result creates the image of FIG. 3 from that of FIG. 1. It will be appreciated that once the image is scanned and digitized such an operation may be performed using a suitably programmed conventional general purpose digital computer. While this is feasible, the use of conventional digital computers is undesirably slow, requiring on the order of 30 seconds or more to process a single image. Because commercial applications of the system of our invention compel alignment much more quickly, we employ a processor with a special architecture to perform the necessary calculations. In this manner alignment may be verified in less than about 0.1 seconds.

There are several approaches for approximating the Laplacian of Gaussian convolution of the irregular pattern we create. For example, a difference of 2 Gaussian convolutions where the Gaussians have space constants $\sigma_e$ and $\sigma_i$ such that:

$$1 < \frac{\sigma_i}{\sigma_e} < 2 \qquad (2)$$

or so, and the Gaussians are normalized to have the same volume provides a very close approximation of the Laplacian of Gaussian convolution. The Laplacian of Gaussian convolution may also be considered as a bandpass filter because the Gaussian is a low-pass operation and the Laplacian a high-pass operation. Neither operation has very sharp roll-off to either side of the center frequency. Any filter with properties such as above will be appropriate for the approach we employ. Importantly, we only use the sign of the convolved signal because our technique relies upon the zero crossing locations of the convolution.

Applied to the image of FIG. 1 with an operator diameter about ten times the dot separation or larger, our technique exhibits in its sign pattern structures correlated with the clustering structure of the original dot pattern and not with individual dots. Because the sign pattern is thus tied to the overall position of the dot pattern on the image surface, and not with any particular location for any finer feature, it is insensitive to small distortions such as fringe effects, interference, dirt, noise, etc., which are present in the imaging. Because this technique captures coarse scale structure of the patterns and is relatively insensitive to high frequency noise, it is ideally suited to scanning electron microscope images of the patterns, which typically exhibit significant noise.

After filtering the next step of our method is to measure displacements between the patterns 12 and 24 (FIG. 2a) using a correlation function. The correlation function of the sign of the Laplacian of Gaussian convolution can be estimated as follows: Let the image $I(x,y)$ be a Gaussian random process with uniform spectrum and let $$C(x,y) = \nabla^2 G * I(x,y) \quad (3)$$

where * denotes a two-dimensional convolution. The correlation of $C(x,y)$ when the image $I(x,y)$ is taken to be Gaussian white noise has the form $$R_c(\tau) = k\left[1 - \frac{4\tau^2}{w^2} + \frac{2\tau^4}{w^4}\right]\exp\left[\frac{-2\tau^2}{w^2}\right] \quad (4)$$

where k is a constant and W is the diameter of the negative central region of the $\nabla^2 G$ convolution function. The correlation $R_s(\tau)$ of the sign of Eq. (3), $S(x,y) = \text{sgn}[C(x,y)]$, obeys an arcsin law when C is a Gaussian random process.

$$R_s(t) = \frac{2}{\pi}\sin^{-1}\left[\frac{R_c(\tau)}{R_c(0)}\right] \quad (5)$$

FIG. 4 shows the correlation function of the sign of a Laplacian of Gaussian convolution. As shown by FIG. 4, when two patterns such as depicted in FIG. 3 are compared with each other, a single strongly correlated location, corresponding to the peak of the cone in FIG. 4, results. Misalignment, either horizontally or vertically, by any significant amount, results in a much lower correlation. The width of the base of the cone is controlled largely by the size of the filter employed, with larger filters providing broader cones. Sharpness of the peak is due to the binary nature of the filtered image. The use of the sign, rather than the raw convolution values, also causes the correlation peak to be normalized with a height of one in the absence of noise. Once the height of the correlation surface has been measured at several locations around the peak, a model of the surface may be constructed and the peak location estimated with great accuracy. Once this process is performed for each of target 12 and target 24 (see FIG. 2a), the separation between the peaks may be accurately calculated and compared with the desired value to thereby provide an indication of the respective alignment of the two targets. Of course, because each of the targets 12 and 24 was formed at the same time as other regions in that layer of the semiconductor structure, their relative alignment also provides information about the relative alignment of everything in the respective layers.

Use of a second target on wafer 10 or layer 20 would allow triangulation to measure offset in a perpendicular orientation to FIG. 2b. Furthermore, although the targets are shown as in the wafer and in photoresist on the wafer, such targets could be formed in any two layers if it is desired to determine their relative alignment, for example, in a silicon nitride masking layer and in a second layer of metal connections.

Unfortunately, using the above-described technique to align the regions on the semiconductor structure has an undesirable side effect in that it requires an imaging system with very high geometric precision because the two targets are placed side by side. For example, if the patterns on the two layers being checked for alignment are separated by 100 microns and the imaging system has a geometric accuracy of 2%, then there will be a ±2 micron uncertainty introduced by the imaging system. This 2 micron uncertainty may be more than an order of magnitude greater than the precision desired in making such measurements. Accordingly, we have invented a further technique for alignment and verification of alignment of regions on semiconductor structures.

FIG. 5 illustrates another irregular dot pattern ("B") fabricated at a desired location on a semiconductor structure. As with FIG. 1 the individual "dots" are spaced apart by one dot height and width. By superimposing this second independent pattern "B" on the first pattern "A" with the dots of pattern "B" falling into the spaces of pattern "A," each pattern may be treated as noise to the other when the position of each is determined. The positions of the two patterns then may be compared to determine whether the patterns are correctly aligned. The pattern "A+B" shown in FIG. 6 is an example of this approach. It has been created by combining the pattern depicted in FIG. 1 with that shown in FIG. 5. Each of FIGS. 1 and 5 have dot patterns which are spaced on a distance which is twice the dot diameter. In FIG. 6, one of the patterns is shifted by one dot diameter to the left and down before being combined with the other pattern. In this manner, the dots of the two patterns do not overlap. Thus, with reference to the example previously described, the pattern of FIG. 1 will have been formed on the wafer substrate, while the pattern of FIG. 5, shifted by one dot diameter both horizontally and vertically, is formed in the overlying photoresist. When viewing the structure from above, both patterns will be visible.

FIG. 7 illustrates the convolution sign pattern achieved using the Laplacian of Gaussian filter described above for the dot pattern of FIG. 5. FIG. 8 is a corresponding pattern for FIG. 6. Note that the sign pattern of FIG. 8 does not resemble either of the patterns of FIGS. 3 or 7. There is, however, a significant correlation between the sign structure in FIGS. 8 and 3 and also between FIGS. 8 and 7. This is illustrated by the correlation plots of FIG. 9. The upper plot in FIG. 9 represents the correlation between FIG. 8 and FIG. 7, while the lower plot represents the correlation between FIG. 8 and FIG. 3. In the manner previously described, the position of the peak in the individual plots may be determined by making use of as many measurements of the correlation surface as desired. In this manner the peak of each may be accurately determined. Once the individual peaks are located, the difference in peak positions for the two surfaces represents the alignment error between the two layers. As with the example of FIG. 2, this difference may be determined within a very small fraction of the diameter of a pixel. Because the two patterns, A and B, lie in the same part of the camera image and the correlation peaks for each of them are typically separated by less than a dot diameter, the geometric distortion of the optical system has a negligible effect on accuracy.

As an example of the precision with which the peak position may be determined, the upper correlation surface of FIG. 9 was sliced at discrete correlation values beginning with c=0.2 in increments of 0.03. Each slice produces a disk shaped cross-section of the cone shaped correlation surface. The x positions of the boundary points on this disk were carefully estimated using linear interpolation. Then, the disk's center of mass in the X direction was calculated. Likewise the center of mass was calculated for each of the other slices taken through the correlation surface. Finally the average of all the centers of mass was taken to estimate the x position of the correlation peak. The same process was then used to estimate the peak position of the lower surface in FIG. 9. As a result, even though the images were made with a Vidicon camera having about a 2% geometric distortion across its field of view, the difference in peak position for horizontal alignment was only about 1/20th of a pixel. The effective pixel size here was about the same as the pattern's dot size, thus a 1 micron dot provides an alignment resolution of approximately 0.05 microns.

The approach described above also can be employed to align masks *prior* to exposing the photoresist by imaging the mask pattern onto the substrate at suitably low energies (or appropriate wavelengths) to prevent exposure of the photoresist. Employing the same steps as described above, the alignment of the projected pattern and pattern present in the previous layers may be compared. Furthermore, because the photoresist is not exposed, any errors detected may be corrected by the stepper or other mask fabrication apparatus.

FIG. 10 illustrates a test pattern for measuring critical dimensions on an individual layer of an integrated circuit structure. The pattern of FIG. 10 is fabricated by forming on a single layer of the integrated circuit device a pattern of the type depicted in FIG. 6, that is, a pattern which is itself a combination of two other constituent patterns. The constituent patterns are designed such that obscuring bars which extend through the pattern obscure the right-hand edges of the pattern elements on the "right" pattern and the left-hand edges of the pattern elements on the "left" pattern. Although the pattern formed on the integrated circuit itself consists of two patterns, the pattern is formed in one operation or process step, not two. The two constituent patterns, however, are separately stored in the memory of our system and separately filtered. The pattern on the integrated circuit then may be employed to measure critical dimensions in the manner described below. The foregoing approach for measuring critical dimensions on integrated circuit structures functions because the pattern analysis technique ignores the regular obscuring bars, and is sensitive only to the perceived position of the random elements. This is because the regular bar pattern in FIG. 10 has a small low spatial frequency content compared with that of the dot patterns, and so the resulting sign pattern of the $\nabla^2 G$ condition is essentially independent of the presence or absence of the regular bar pattern.

The manner by which the critical dimensions may be measured is depicted in FIGS. 11a and 11b. As shown in FIG. 11a, the "actual" pattern is underexposed (assuming positive photoresist) in comparison to the nominal "intended" pattern. FIG. 11b illustrates that when the bars, which the $\nabla^2 G$ filter does not see, are removed, the centers of the individual elements having left edges obscured appear to shift to the right, while the pattern with right edges obscured appears to shift to the left. In comparison, if the pattern is overexposed (again, assuming positive photoresist), the actual pattern will be smaller than the intended pattern. In this case, the detected position of the pattern with left edges obscured appears to shift to the left, while the pattern with right edges obscured appears to shift to the right.

Thus, to measure critical dimensions after the pattern has been formed, the image of the complete pattern (both left and right patterns—see, e.g., FIG. 10) is acquired and filtered. Next, in a manner like that described in conjunction with FIG. 9, the convolution of the stored "left" pattern is correlated with the combined pattern, and the convolution of the stored "right" pattern is correlated with the combined pattern. Once the peaks of the two correlations are determined, an offset between them may be calculated. This offset will provide information about the critical dimension on the integrated circuit. For example, if the pattern is nominal as desired, then the "left" and "right" correlation peaks will coincide. On the other hand, if the pattern is underexposed, the correlation peak for the "right" pattern will be shifted away from the "left" pattern's peak. If the fabricated pattern is overexposed, then the correlation peak of the right pattern will appear shifted to the other direction with respect to the left pattern. The displacement between the two peaks thus will indicate the critical dimension error.

FIG. 12 is a simplified flowchart illustrating a preferred embodiment of one method of our invention. The method will be discussed in conjunction with the embodiment of FIGS. 6 and 9. As has been described, a first irregular pattern A is placed on one layer of the integrated circuit, and a second irregular pattern B (or A in some embodiments) placed on another layer, either immediately above pattern A (or adjacent pattern A). An image of the composite pattern is then acquired and correlated with a stored model of pattern A, then with a stored model of pattern B. The difference between the peak positions of these two correlation surfaces represents the alignment error between the two layers.

FIG. 12 is a flowchart illustrating the overall correlation process. As shown in FIG. 12, two inputs are supplied to the process, a stored pattern 30, and a digitized image 31 preferably acquired using an optical or scanning electron microscope. An optical microscope is preferred for embodiments where cost is a significant factor in application of the system. Adjustments in the size of the image may be made using the magnification control. These adjustments will affect the height of the peak and permit compensating for errors in the SEM preset. With respect to the example in which the combined pattern (A+B) is correlated with the first pattern A, the stored pattern 30 will consist of digital data representative of the pattern A formed on the underlying semiconductor layer. The image 31 will be of the combined patterns A+B. Once the stored pattern 30 is retrieved, any necessary scaling 32 is applied to the pattern to convert it to the proper size for comparison with the acquired image 31. In the preferred embodiment, scaling is accomplished by using conventional image scaling software. Typically this scaling operation will be done infrequently since the scaled image can be stored and reused. Fine adjustments to the magnification can be made using feedback from the correlation hardware to determine the magnification that yields the highest correlation peak.

After scaling step 32 is performed, the representation of the stored pattern is filtered to attenuate higher spatial frequencies while preserving some of the lower spatial frequencies. This step is represented by block 34. The apparatus for performing the filtering is described below. In a similar manner the acquired image is also filtered, as shown by step 33. The results of the filtered data are each stored, with the image being stored in storage 35 and the representation of the pattern A stored in storage 36. Note that storage 36 can be established once and then reused so long as the patterns and imaging geometry are not changed. Under external control, typically from a microprocessor 39, the contents of the two random access memories 35 and 36 are dumped to an exclusive OR gate 37. The exclusive OR gate, 37, in effect, counts the "hits" to determine the correlation between the stored pattern 30 and the image 31. By supplying a different offset to one of the RAMs 35 or 36 than to the other, the digital representations of the images may be shifted with respect to each other for comparison. Counter 38 will count the hits for each shift, in effect, enabling the microprocessor 39 to measure selected points on the peaked correlation surface. Once a sufficient number of measurements have been made, the location of the peak can be estimated.

In a manner analogous to that described above, the procedure of FIG. 12 may be repeated, this time with the stored pattern representing pattern B and the scanning electron microscope image again representing the combined patterns. In this manner, the correlation surface for pattern B correlated with the combination of patterns A and B may be determined. Once the two peaks are determined, the alignment error is represented by the distance between the two peaks.

If it is desired to measure critical dimensions, then the procedure described in conjunction with FIG. 12 will be employed, with the stored pattern on a first pass representing one of the left or right patterns, and on a second pass representing the other of the left and right patterns. In the manner explained above, the difference in location between the peaks will be indicative of the critical dimension sought to be measured.

Apparatus for Carrying Out the Method

As mentioned above, to carry out the method of our invention in a practical or commercial context, the images acquired or retrieved must be processed much more rapidly than a general purpose digital computer would permit. Accordingly, one of us has developed certain special purpose hardware for performing the filtering functions at a sufficiently high rate to enable alignment measurements to be made in less than 0.1 seconds.

In the case of either retrieval of a stored pattern or acquisition of an image through an optical or scanning electron microscope, a digital representation of the pattern is required. In the case of retrieval of a stored pattern, because the pattern is stored digitally, only scaling is required. In the case of an optical or SEM image, however, the image must first be digitized using, for example, a commercially available A/D converter operating at video rates. For the sake of explanation, assume that in the preferred embodiment, the pattern to be filtered consists of approximately 50 by 50 elements and is displayed in an area of approximately 500 by 500 pixels.

Once the digitized pixel pattern has been acquired, the first step of our method is to apply the Laplacian function. Although either the Laplacian or Gaussian functions could be applied first without affecting the result, one of us determined that application of the Laplacian function first provides certain advantages. In particular, by applying the Laplacian function first, the video signal is centered on zero and then smoothed. This allows better use of n bit integer resolution because the n bit numbers are not required to characterize as wide a range of signal as would exist were the Gaussian function applied first. Applying the Laplacian first reduces the amount of scaling required through the Gaussian pipeline operation to keep the values in range.

The 500-pixel square image 40 is shown at the top of FIG. 13. If the Laplacian function is to be applied to pixel C, then the 8 bit binary value for each of pixels A-E must be retrieved and appropriately weighted. The apparatus of FIG. 13 illustrates one technique for retrieving the desired pixels. As the desired pattern is acquired as a noninterlaced video raster scan, either from memory 44 or from microscope 42 and A-D converter 43, at some given instant pixel A will be supplied on line 45. At that point in time, line 46 will carry B, the value received 499 pixels earlier. Similarly, lines 47, 48, and 49 will hold pixels C, D, and E, respectively, which were received 500, 501 and 1000 pixels earlier than A. Thus, this configuration produces 5 simultaneous samples making a cross pattern off of the image as shown at the top of FIG. 13. Note that when the next pixel arrives at 45, the entire cross pattern of samples will move one pixel to the right on the image following the raster scan. As the value for each pixel is retrieved, it may be latched before being supplied to subsequent processing. The delay elements 50 shown in FIG. 13 may comprise any known delay element, for example, a shift register or a random access memory. Switches 51 and 52 control whether the pixels latched are from the retrieved pattern 44 or the acquired image 40.

FIG. 14 illustrates apparatus for obtaining the Laplacian of the acquired pixel values. One of us has determined that a satisfactory approximation to the Laplacian function at a given pixel location is to apply a weight of 4 to that particular pixel and a weight of −1 to the pixels above, below, to the left, and to the right of the specified pixel. As shown in FIG. 14, the pixel values for pixels A and B are supplied to adder 60, while those for pixels D and E are supplied to adder 61. As a result, adder 6D supplies an output signal A+B on line 62, while adder 61 supplies an output signal D+E on line 63. Another adder 64 connected to receive the signals on line 62 and 63 then supplies an output signal on line 65 indicative of the sum of all of pixels A, B, D, and E.

The pixel value for pixel C is supplied to a shifter 66. By shifting the pixel value two places left, the value is effectively multiplied by four, and the results supplied on line 67 to subtractor 68. Subtractor 68 combines the sum supplied on line 65 with the quadruply-weighted value on line 67 to achieve a new value which approximates the Laplacian at pixel C of the input image. Thus the output 68 carries a video raster signal of the Laplacian of the input image. This signal is fed to the next stage of processing, the Gaussian convolver.

The manner by which the Gaussian convolution is applied is shown in FIGS. 15 and 16.

In our preferred embodiment, we make use of the fact that a two-dimensional Gaussian convolution can be decomposed into a composition of one-dimensional Gaussian convolutions. To see this, note that the two-dimensional Gaussian can be written as the product of two one-dimensional Gaussians:

$$G(x, y) = \exp\left[-\frac{x^2 + y^2}{\sigma^2}\right] \quad (6)$$

$$= \exp\left[-\frac{x^2}{\sigma^2}\right]\exp\left[-\frac{y^2}{\sigma^2}\right] \quad (7)$$

$$= G(x)G(y) \quad (8)$$

This allows us to decompose the two-dimensional convolution integral as follows:

$$G(x,y)*I(x,y) = \int_{-\infty}^{\infty}\int_{-\infty}^{\infty} G(u,v)I[(x-u),(y-v)]dudv \quad (9)$$

$$(10)$$

$$= \int_{-\infty}^{\infty} G(v) \int_{-\infty}^{\infty} G(u)I[(x-u),(y-v)]dudv$$

$$= G(y)*[G(x)*I(x,y)] \quad (11)$$

where I(x,y) is the input image to be convolved.

Thus, we are able to accomplish a two-dimensional Gaussian convolution by means of two cascaded one-dimensional convolutions which are much less expensive computationally to accomplish. The one-dimensional Gaussian operator may be approximated by a binomial distribution in one dimension. For example, the seven point binomial distribution 1, 6, 15, 20, 15, 6, 1 is quite close to the Gaussian. In our preferred embodiment, we employ a three point binomial operator with weights of 1, 2, 1 three times to produce the effect of a convolution with the seven point binomial distribution. This choice allows a particularly efficient hardware implementation. This is illustrated in FIG. 16.

FIG. 15 illustrates the operation of the three point mechanism, $G_3$. A digital raster input is applied to the input of two serially connected delay elements. These delay elements will both introduce a delay of n pixels between their input and output terminals, where n = 1 or 2 pixels for horizontal convolutions and u = the image line length or twice the image line length for vertical convolutions. From these delay elements we obtain 3 simultaneous values A, B, and C separated by n pixels from each other in the image. A and C are applied to adder 70 and the sum supplied on line 71 to a shifter 72. Shifter 72 shifts the sum of A+C one place to the right, in effect dividing it by two. The output signal on line 73 is supplied to adder 74 in conjunction with the binary value for pixel B. Adder 74 thereby provides on line 75 a value equal to the sum of the value of pixel B plus one-half the sum of values of pixels A and C. To maintain correct amplitude, this result is shifted right one place by shifter 76, and the result supplied on line 77. The result on line 77 is the input signal smoothed by a 3 point binomial distribution. To obtain a finer approximation to the Gaussian, the procedure of FIG. 15 may be repeated more than once as shown in FIG. 16.

FIG. 16 illustrates how a pipeline of 3 three point Gaussian convolution elements $G_3$ of FIG. 15 is configured. This device convolves the input video stream with a 7 point binomial approximation to a one-dimensional Gaussian $G_7$. If the delay elements are set to produce a delay of one pixel, this will be a horizontal Gaussian convolution. If the delay elements are set to the line length of the image this will be a vertical convolution.

Convolving with a seven point normalized Gaussian operator reduces the amplitude of a typical Laplacian filtered image by about a factor of two. In the preferred embodiment, therefore, we need shift one less bit right for each seven point Gaussian operator. In other words, the amplitude of the output signal is boosted by a factor of two after application of each seven point Gaussian operator. In terms of the hardware required, this allows us to gain one bit of precision with each subsequent seven point Gaussian operator. Thus, in a preferred system having four such operators, four bits are gained, or equivalently four bits are saved in the pipeline data width while obtaining the same precision in the final output. One of the $G_3$ operators of each $G_7$ operator does not include the normalization operation for the reasons discussed above. To accomplish a 7 by 7 two-dimensional Gaussian convolution, we assemble two $G_7$ elements, one with delay set to do a horizontal convolution and the other with delay set for a vertical convolution.

The lower portion of FIG. 16 illustrates using a pipeline of two $G_7$ elements to produce a $G_{7\times7}$ element. In practice, a larger Gaussian filter than the 7 by 7 operator described is required. Similar techniques as described above could be used to build arbitrarily large filters, however we have found a more efficient approach. After the application of the $G_{7\times7}$ filter, the input signal has been low pass filtered sufficiently that a subsequent operator that samples only every other pixel will not suffer from aliasing problems. Thus a 14 by 14 Gaussian convolution can be approximated by the $G_{7\times7}$ operator with its points spread out by increasing its horizontal delays from 1 to 2 pixels and its vertical delays from one line length to two line lengths.

FIG. 17 shows two $G_{7\times7}$ elements used in this way to produce effectively a 21 by 21 Gaussian convolution operator in a video pipeline with the Laplacian operator at the start. The result is a $\nabla^2G$ filtered image which may be supplied to suitable storage means, for example, a random access memory such as described in conjunction with blocks 35 and 36 of FIG. 12. Because only the sign of the result is saved, the filtered image will be a binary one, having the appearance, for example, of FIGS. 3, 7 or 8.

FIG. 18 is a more detailed block diagram of one embodiment of the correlator previously shown in only block form in FIG. 12. Generally, the components shown in FIG. 18 are driven by a 10 megaHertz pixel clock. On the rising edge pixel data is stored into the buffers 80a–80f, while on the falling edge pixel data is read out. In the preferred embodiment the filtered image input data (from FIG. 17) is supplied in parallel to six buffer networks 80a–80f shown in FIG. 18. The contents of one of the buffers 80a is shown in greater detail; similar components make up each of the remaining buffers 80b–80f. Buffer 80 includes a 64k-by-1 bit memory 81 for storing approximately one-quarter of the image. Memory 81 corresponds to either block designated storage in FIG. 12. In the preferred embodiment memory 81 is a static random access memory and stores 256-by-256 pixels of data. The choice of the size of memory 81 is arbitrary, and larger or smaller memories may be employed depending upon the particular application for the correlator of FIG. 18. Storage of the convolver output data in memory 81 allows scanning of the contents of the memory for purposes of image correlation.

Address generator counters 82 supply addressing information to the memory 81 to control the location where data from the convolver is stored. The address generator counters typically include a first counter for identifying a unique horizontal line, and a second counter for identifying a pixel position on that line. The addresses from which data in the static random access memory 81 are read are controlled ultimately by counter 83 and x,y register 84. X,y register 84 provides information regarding the center point of a correlation window on the image. By varying the position of the window's center point, one image may be shifted with respect to the other. Counter 83 counts the number of points in a window to be compared with the other image data in other buffers, while offset table 85 provides information regarding the offset within the window of each image point to be compared. The offset table 85 will typically contain about 4,000 points. Data from the offset table 85 and from the x,y register 84 are combined by adder 86 to provide read address information for memory 81. The data from the convolver are supplied both to the left buffer 80a and the right buffers 80b–80f. Typically, the left buffer, 80a, will be filled with convolver data from either the stored pattern or from the SEM. The right buffers would then be filled with convolver data from the other source. The use of six buffers allows five values to be generated by the exclusive OR networks 90a–90e during each cycle. The left buffer allows one value to be used for comparison, while the five right buffers allow five locations in the right image to be examined in parallel. These five ports onto the right image allow 5 points on the same correlation surface, FIG. 4, to be computed in parallel. They can also be used to compute a single large correlation window by breaking it into five subwindows.

The offsets are provided through a look-up table and index to each point in the correlation window. This allows comparison of any desired set of points in one image with any desired set of points in another image. This facility allows correcting for fixed geometric distortions between the two images. It also allows placing more emphasis on the center of the correlation window by spacing the samples more closely near the center of the image.

Each of the exclusive OR networks 90a–90e contains a latch 91, an exclusive OR gate 92, and one or more counters depending upon the number of bits of counting desired. Latch 91 holds the output value from the left buffer and one of the right buffers (depending upon which exclusive OR network) and supplies the resulting data to the exclusive OR gate 92. XOR gate 92 drives desired counters to provide as many bits of accuracy as desired. In the preferred embodiment a 12-bit counter 93 is provided by three smaller 4-bit counters. Read enable lines coupled to the counters 93 enable supplying the output from a desired counter to a transceiver (not shown).

In another embodiment of our invention, patterns already present in the integrated circuit masks and layers are employed in place of the irregular patterns especially generated. In many integrated circuits, the patterns in the masks have sufficient low spatial frequency energy. Furthermore, the patterns on various layers are somewhat independent from each other and combine in an additive manner. In such an application, a larger area of the "chip" may be employed for measuring the correlation function against a CAD data base for each layer. The larger area available for correlation compensates for the less-than-ideal patterns.

Although preferred embodiments of the method and apparatus of our invention have been described above, these embodiments are for the purposes of illustration and not limitation. The scope of our invention may be determined from the appended claims.

We claim:

1. A method of determining alignment of regions formed on a semiconductor structure during separate process steps comprising:

defining a first pattern at a first location on the semiconductor structure during a first process step also used to define a first region on the semiconductor structure and at a second location on the semiconductor structure during a second process step also used to define a second region on the semiconductor structure;

acquiring an image of the first patterns at the first and the second locations with apparatus to provide an image;

spatially filtering the image to attenuate at least some higher spatial frequencies while preserving at least some lower spatial frequencies to thereby provide a filtered image of the first patterns; and using the filtered image to determine alignment of the first pattern at each of the first and second locations to thereby determine alignment of the first and second regions on the semiconductor structure.

2. A method as in claim 1 wherein the step of filtering comprises low pass filtering of the image.

3. A method as in claim 2 wherein the step of filtering further comprise applying a two-dimensional Gaussian convolution.

4. A method as in claim 3 wherein the step of filtering further comprises applying both a Laplacian operator and the Gaussian convolution to thereby provide convolution values, each value having a sign.

5. A method as in claim 4 wherein the step of using the filtered image comprises correlating the sign of the convolution values of the filtered image at the first location with the sign of the convolution values of the filtered image at the second location.

6. A method as in claim 1 wherein the first location and the second location are adjacent each other, but in different layers.

7. A method as in claim 6 wherein the second process step is performed on a different layer of the semiconductor structure than the first process step.

8. A method as in claim 1 wherein the first pattern is an irregular pattern.

9. A method as in claim 7 wherein the first pattern comprises a first plurality of elements disposed in an array and spaced apart from each other.

10. A method as in claim 9 wherein the elements comprise regions having a dimension of a minimum size fabricatable using the first process.

11. A method as in claim 10 wherein the elements are randomly disposed in the array.

12. A method of determining alignment of regions formed on a semiconductor structure during separate process steps comprising:

defining a first pattern at a first location on the semiconductor structure during a process step, the process step also being used to define a first region;

defining a second pattern also at the first location on the semiconductor structure during another process step, the another process step also being used to define a second region, the second pattern overlying the first pattern;

acquiring an image of both the first and second patterns at the first location;

spatially filtering the image to attenuate at least some higher spatial frequencies while preserving at least some lower spatial frequencies to thereby provide a filtered image; and comparing the filtered image with a second filtered image of each of the first pattern and the second pattern to thereby determine alignment of the first and second regions on the semiconductor structure.

13. A method as in claim 12 wherein the step of filtering comprises low pass filtering of the image.

14. A method as in claim 13 wherein the step of filtering further comprises applying a Laplacian operator.

15. A method as in claim 14 wherein the step of filtering further comprises applying a two-dimensional Gaussian convolution to thereby provide convolution values, each value having a sign.

16. A method as in claim 15 wherein the step of comparing the filtered image comprises correlating the sign of the convolution values of the filtered image with the sign of the convolution values of the stored filtered image of each of the first and second patterns.

17. A method as in claim 12 wherein the first pattern comprises a first plurality of small elements disposed in an array, each element spaced apart from each other element.

18. A method as in claim 17 wherein the second pattern comprises a second plurality of small elements disposed in an array, each element spaced apart from each other element.

19. A method as in claim 18 wherein the step of defining a second pattern further comprises defining the second pattern at the first location with the elements of the second pattern disposed between the elements of the first pattern.

20. A method as in claim 19 wherein the elements in each of the first and second patterns are disposed substantially randomly in the respective array.

21. A method as in claim 12 wherein the step of defining the first pattern comprises forming the first pattern in a desired layer of the semiconductor structure.

22. A method as in claim 21 wherein the step of defining the second pattern comprises forming the second pattern in a selected layer of the semiconductor structure overlying the desired layer.

23. A method as in claim 22 wherein the selected layer comprises photoresist.

24. A method as in claim 23 wherein the step of forming the second pattern comprises illuminating the photoresist but not exposing it.

25. A method of determining a dimension on a semiconductor structure comprising:

defining a composite pattern of elements having edges, at a location on the semiconductor structure, the composite pattern being comprised of a first pattern and a second pattern, each of the first and the second patterns including a first and a second set of edges;

defining a plurality of obscuring means extending through the composite pattern, the obscuring means obscuring the first set of edges of the element of the first pattern and the second set of edges of the elements of the second pattern;

acquiring an image of the composite pattern and the obscuring means;

spatially filtering the image to attenuate at least some higher spatial frequencies while preserving at least some lower spatial frequencies to thereby provide a filtered image; and comparing the filtered image of the composite pattern with a stored filtered image of the first pattern and with a stored filtered image of the second pattern to thereby determine any shift in the location of the first and second patterns which shift is indicative of the dimension to be determined.

26. A method as in claim 25 wherein the first pattern comprises a first plurality of small elements disposed in an array.

27. A method as in claim 26 wherein the second pattern comprises a second plurality of small elements disposed in an array.

28. A method as in claim 27 wherein the small elements of each of the first and the second patterns comprise elements having spaced apart edges and wherein the first set of edges is opposite the second set of edges.

29. A method as in claim 25 wherein the step of filtering comprises low pass filtering of the image.

30. A method as in claim 29 wherein the step of filtering further comprises applying a Laplacian operator.

31. A method as in claim 30 wherein the step of filtering further comprises applying a two-dimensional Gaussian convolution to thereby provide convolution values, each value having a sign.

32. A method as in claim 31 wherein the step of comparing the filtered image comprises correlating the sign of the convolution values of the filtered image with the sign of the convolution values of each of the stored filtered image of each of the first and second patterns.

33. A method of determining alignment of regions defined on media during separate process steps comprising:

defining a first pattern at a first location on the media during a process step used to define a first region;

defining a second pattern also at the first location on the media during another process step used to define a second region;

acquiring an image of both the first and second patterns at the first location;

spatially filtering the image to attenuate at least some higher spatial frequencies while preserving at least some lower spatial frequencies to thereby provide a filtered image; and comparing the filtered image with a stored filtered image of the first pattern to thereby determine alignment of the first and second regions on the media.

* * * * *

UNITED STATES PATENT AND TRADEMARK OFFICE
CERTIFICATE OF CORRECTION

PATENT NO. : 5,109,430

DATED : April 28, 1992

INVENTOR(S) : Nishihara, et al.

It is certified that error appears in the above-identified patent and that said Letters Patent is hereby corrected as shown below:

On the cover sheet, under "Related U.S. Application Data", first line, kindly delete "1959" and insert therefor —1989—.

On the cover sheet, under "Other Publications", line 9, kindly delete "i".

Signed and Sealed this

Thirty-first Day of August, 1993

Attest:

BRUCE LEHMAN

Attesting Officer

Commissioner of Patents and Trademarks